United States Patent [19]

Cowan et al.

[11] Patent Number: 4,862,020

[45] Date of Patent: Aug. 29, 1989

[54] ELECTRONIC DELAY CONTROL CIRCUIT HAVING PULSE WIDTH MAINTENANCE

[75] Inventors: Clarence E. Cowan, Newberg, Oreg.; Ronald K. Christensen, Aloha, Oreg.

[73] Assignee: Tektronix, Inc., Beaverton, Oreg.

[21] Appl. No.: 208,450

[22] Filed: Jun. 20, 1988

[51] Int. Cl.[4] .......................................... H03K 17/28
[52] U.S. Cl. ...................... 307/601; 307/360; 307/263; 307/265; 307/603
[58] Field of Search ........... 307/494, 360, 529, 263, 307/265, 595, 597, 600, 601–603, 605; 328/55

[56] References Cited

U.S. PATENT DOCUMENTS

| | | | |
|---|---|---|---|
| 3,906,247 | 9/1975 | Heffner | 307/601 X |
| 3,952,213 | 4/1976 | Fukaya | 307/601 X |
| 4,567,378 | 1/1986 | Raver | 307/263 X |
| 4,645,958 | 2/1987 | Suzuki et al. | 307/597 |
| 4,675,546 | 6/1987 | Shaw | 307/601 X |
| 4,691,120 | 9/1987 | Kondo | 307/265 |
| 4,797,586 | 1/1989 | Traa | 307/603 |
| 4,801,827 | 1/1989 | Metz | 307/602 |

FOREIGN PATENT DOCUMENTS

| | | | |
|---|---|---|---|
| 0102017 | 6/1985 | Japan | 307/601 |
| 0117914 | 6/1985 | Japan | 307/601 |

*Primary Examiner*—David Hudspeth
*Attorney, Agent, or Firm*—Francis I. Gray

[57] ABSTRACT

An electronic delay control circuit provides small, constantly variable delays to an input pulse signal without altering the pulse width of the input signal. The input pulse signal together with a first reference signal are input to three comparators in parallel. The output of one comparator is a pulse signal corresponding to the input pulse signal, and the outputs of the other two comparators are tied together and input to a pulse shaping network to produce delay current pulses for the leading and trailing edges of the input pulse signal. The delay current pulses are added to the output pulse signal to produce a delayed output pulse signal. The delay current pulses are a function of the amount of a constant current steered between the two comparators as determined by a delay control signal.

4 Claims, 3 Drawing Sheets

ELECTRONIC DELAY CONTROL CIRCUIT HAVING PULSE WIDTH MAINTENANCE

BACKGROUND OF THE INVENTION

The present invention relates to digital delay circuits, and more particularly to an electronic delay control circuit that delays an input pulse without changing the pulse width.

In many applications it is desirable to have various pulse signals, such as multiple clock signals, occur at specific time intervals with respect to each other. Careful circuit design can bring the relative timing to within a specified tolerance, but variations in components result in the need to provide some variable delay so that the relative timing can be achieved precisely when the circuit is completed to compensate for such variations. In digital circuits delay may be achieved by inputting a pulse signal to a shift register having a plurality of taps, and then selecting the appropriate tap for the desired delay. The delay is an integer multiple of the clock signal that clocks the shift register, and does not provide for adjustment within the range of values less than one clock cycle. Likewise analog type delay lines with variable components can be used to provide a constantly variable delay time, but such circuits tend to alter the pulse width of the resulting delayed pulse signal. Another technique is to convert the pulse signal into a ramp signal that is input to a comparator for comparison with a variable reference voltage. Again this provides a constantly variable delay time, but at the expense of altering the pulse width of the pulse signal.

What is desired is an electronic delay control circuit that provides a constantly variable delay while maintaining a desired pulse width, i.e., that delays both the leading and trailing edge of the input pulse signal equally.

SUMMARY OF THE INVENTION

Accordingly the present invention provides an electronic delay control circuit that variably delays equally both the leading and trailing edges of an input pulse signal. A pulse signal to be delayed is one input to a first comparator and a reference signal is the other input. The pulse signal together with the reference signal also is input to a second and third comparator at opposite inputs. The outputs of the second and third comparators are input to a pulse shaping network and added to the output of the first comparator to change the slope of the edges of the pulse output of the first comparator. A current steering circuit in response to a delay control signal steers a constant current source between the second and third comparators to vary the amplitude of the outputs of the second and third comparators, and thus the edge slopes of the output pulse signal. The output pulse signal is buffered and output as a delayed pulse signal.

The objects, advantages and novel features of the present invention are apparent from the following detailed description when read in conjunction with the appended claims and attached drawing.

DESCRIPTION OF THE PREFERRED EMBODIMENT

Figure 1:
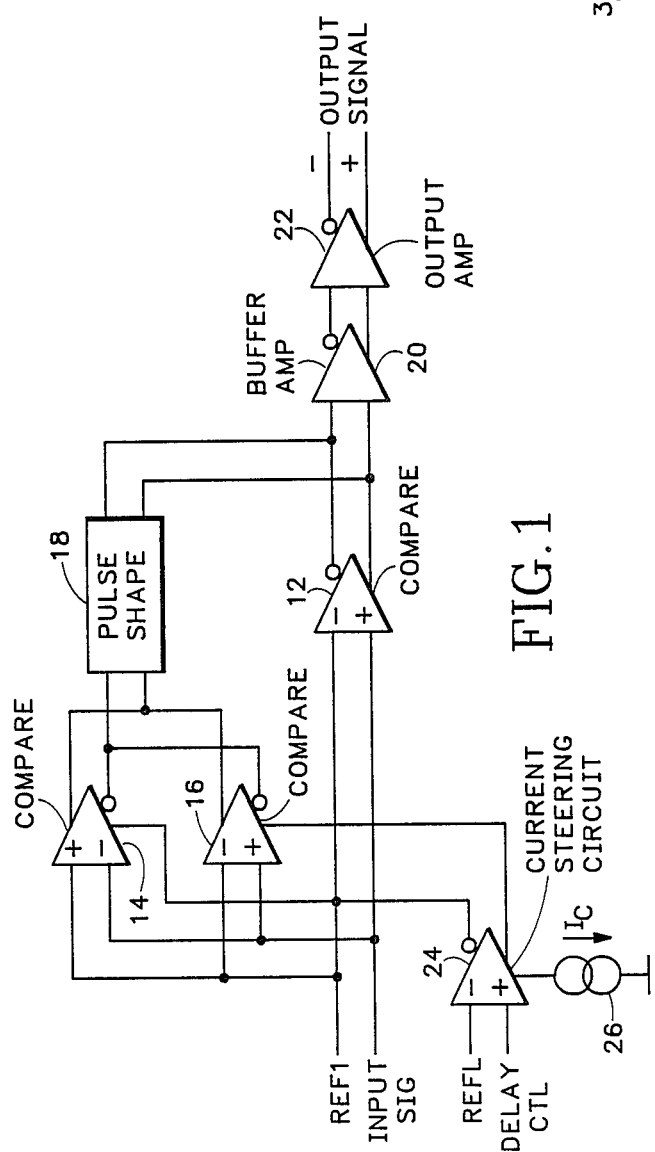
FIG. 1 is a block diagram of an electronic delay control circuit according to the present invention.

Referring now to FIG. 1 a pulse signal is input to a first comparator 12 together with a reference signal REF1 to produce a corresponding pulse output. The pulse signal and the reference signal also are input to a second and third comparator 14, 16 at opposing input terminals. The outputs of the second and third comparators 14, 16 are input to a pulse shaping network 18 to produce a pulsed output for each edge of the input pulse signal. The outputs of the pulse shaping network 18 are added to the pulse output of the first comparator to effectively change equally the slopes of the leading and trailing edges of the pulse output, thus effectively delaying the pulse output. The delayed pulse output is buffered by an amplifier 20 and provided as a complementary output by an output amplifier 22. The delay of the pulse output is controlled by a delay control signal that is input to a current steering circuit 24. A constant current source 26 having a control current Ic is steered between the second and third comparators 14, 16, which in turn determines the amplitude of the pulsed outputs from the pulse shaping network 18.

Figure 2:
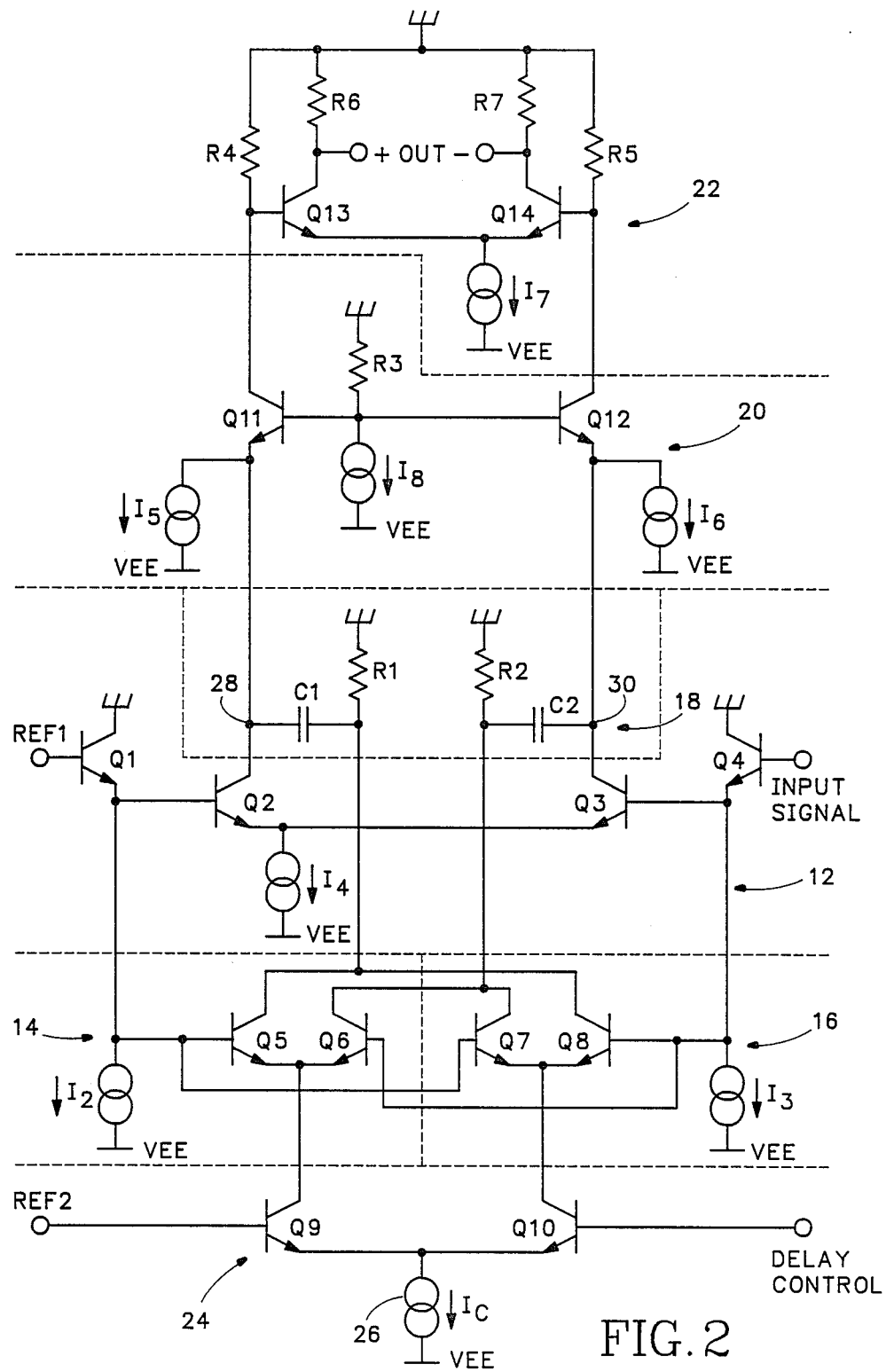
FIG. 2 is a schematic diagram of the electronic delay control circuit of FIG. 1.

A differential implementation of the electronic delay control circuit is illustrated in FIG. 2. The pulse signal to be delayed is input to emitter-follower transistor Q4 which serves to isolate the electronic delay control circuit from external circuit. The input pulse signal is applied as inputs to respective differential amplifier transistors Q3, Q6, Q8. Likewise a first reference signal REF1 is input via isolation transistor Q1 to the respective differential amplifier transistors Q2, Q5, Q7. The outputs of the differential amplifiers making up the second and third comparators 14, 16 are input to respective RC networks, R1C1 and R2C2, which make up the pulse shaping network 18. The outputs from the pulse shaping network 18 are summed with the outputs of the differential amplifier formed by Q2, Q3, which make up the first comparator 12, at nodes 28, 30. The summed output is input to the buffer differential amplifier 20 formed by transistors Q11, Q12 and then input to the differential output amplifier 22 formed by transistors Q13, Q14 to provide complementary outputs. The delay control signal and a second reference signal REF2 are input to the current steering differential amplifier 24 formed by transistors Q9, Q10. The current steering differential amplifier 24 is biased by the control current Ic.

Figure 3:
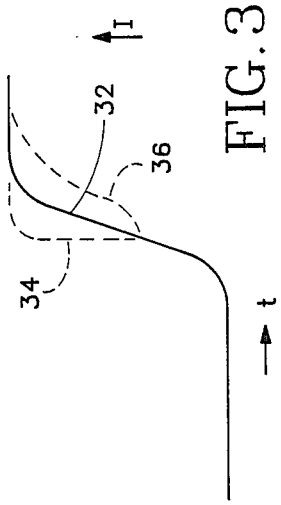
FIG. 3 is a graph of the effect of the electronic delay control circuit of FIG. 1.

In operation when the delay control signal equals REF2, then the control current Ic is divided equally between the two comparators 14, 16. Thus the inputs to the pulse shaping network remain unchanged so that no current pulse is generated across the respective capacitors C1, C2. The pulse input signal therefore provides complementary output pulse signals at the collectors that have a nominal edge slope as shown by the solid line 32 in FIG. 3. If the delay control signal is greater than REF2 and a positive pulse signal is input, then more of Ic flows through comparator 16 than through comparator 14, causing the current input to the pulse shaping network 18 at the junction of R1C1 to increase and the current input at the junction of R2C2 to decrease. This results in a positive current pulse at node 30 and a negative current pulse at node 28 to produce the change in the slope of the output current pulse indicated by the first dotted line 34 in FIG. 3. Likewise the trailing edge of the output current pulse is driven negative faster to maintain the pulse width. Inversely when the delay control signal is less than REF2, comparator 14 conducts more of Ic than comparator 16 and the output current pulse at node 30 is affected as illustrated by the second dotted line 36 of FIG. 3.

Figure 4:
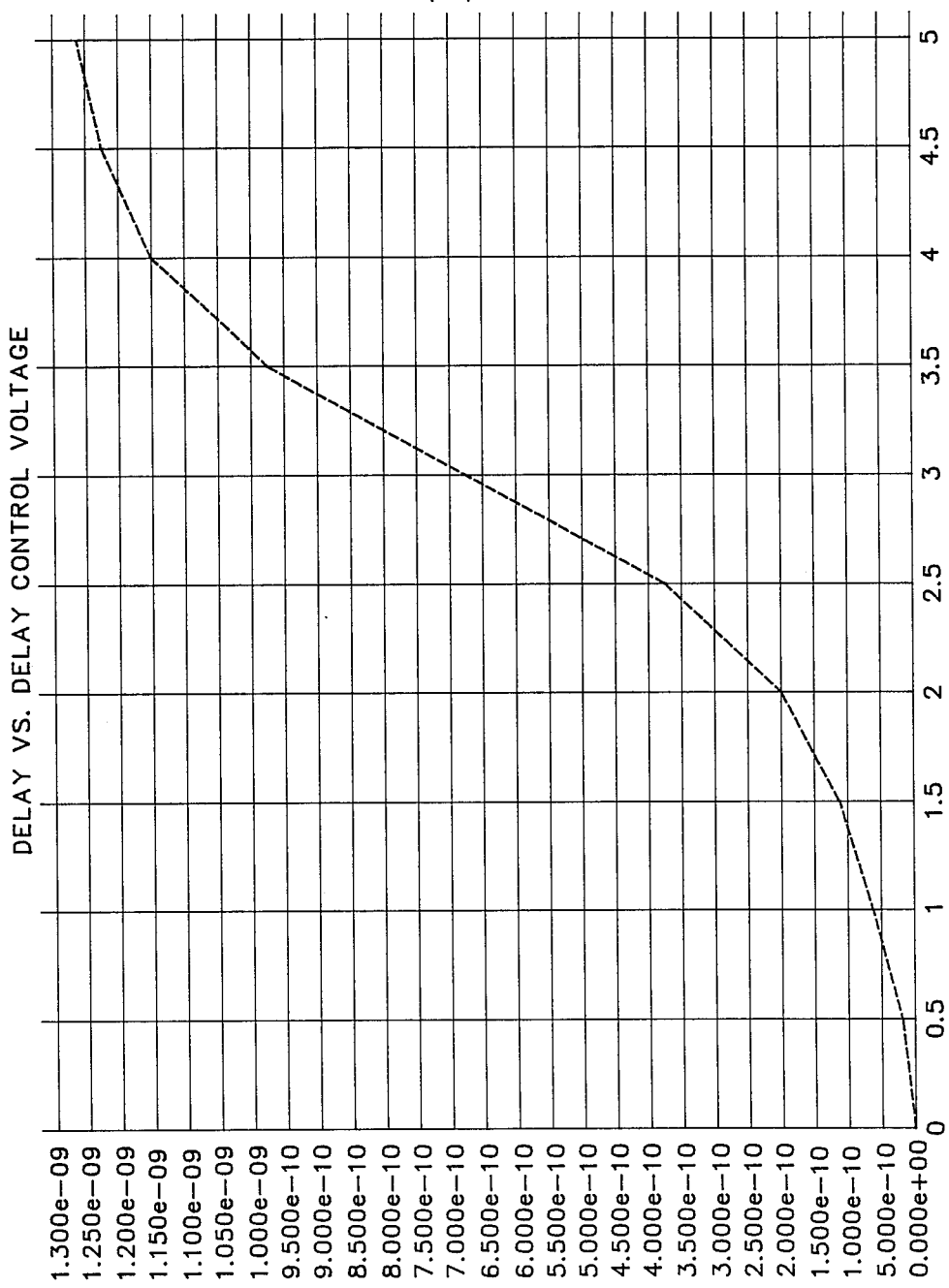
FIG. 4 is a graph of the relationship between the delay control signal and the amount of the delay.

FIG. 4 illustrates the delay characteristics of the circuit of FIG. 2. The delay time is measured in picoseconds over a five volt control range. If REF2 is selected to be in the middle of the range where the characteristic is virtually linear, i.e., at approximately three volts, then a delay control signal in the range of approximately two to four volts provides a delay of approximately ±four hundred and seventy five picoseconds.

If the input pulse signal has the desired duty cycle, then REF1 can be a constant value. However if the input pulse signal does not have the desired duty cycle, then the input pulse signal is converted into a ramp signal prior to input to the isolation transistor Q4. REF1 is then adjusted to provide the desired duty cycle for the output pulse signal. Such a pulse width control is independent of the delay controlled by the delay control signal.

Thus the present invention provides an electronic delay control circuit that effectively provides fine delay adjustment of an input pulse signal without varying its pulse width by adding current pulses to the output current pulse signal at the edges of the input pulse signal, the delay control signal causing a control current from a constant current source to be steered between two pulse shaping networks to generate the pulse currents.

What is claimed is:

1. An electronic delay control circuit comprising:
    means for generating an output current pulse from an input pulse signal;
    means for generating a delay current pulse from the input pulse signal at each edge of the input pulse signal; and
    means for adding the output current pulse and the delay current pulse to produce an output pulse signal corresponding to the input pulse signal delayed by a predetermined amount.

2. An electronic delay control circuit as recited in claim 1 wherein the delay current pulse generating means comprises:
    a first comparator to which the input pulse signal and a first reference signal are input;
    a second comparator to which the input pulse signal and the first reference signal are input oppositely than to the first comparator;
    means for steering in response to a delay control signal a control current between the first and second comparators to vary the amplitudes of the outputs from the first and second comparators; and
    means for shaping the outputs from the first and second comparators to generate the delay current pulse at each edge of the input pulse signal.

3. An electronic delay control circuit as recited in claim 2 wherein the steering means comprises:
    a control circuit having complementary outputs to which the delay control signal and a second reference signal are input, one output being coupled to bias the first comparator and the other output being coupled to bias the second comparator; and
    a constant current source to provide the control current to the control circuit, the amount of the control current being steered to the first and second comparators being a function of the relative levels of the delay control signal and the second reference signal.

4. An electronic delay control circuit as recited in claim 1 further comprising means for adjusting the pulse width of the input pulse signal independently from the delay of the input pulse signal represented by the output pulse signal.

* * * * *